(12) United States Patent
Ando et al.

(10) Patent No.: US 11,037,986 B2
(45) Date of Patent: Jun. 15, 2021

(54) STACKED RESISTIVE MEMORY WITH INDIVIDUAL SWITCH CONTROL

(71) Applicant: INTERNATIONAL BUSINESS MACHINES CORPORATION, Armonk, NY (US)

(72) Inventors: Takashi Ando, Tuckahoe, NY (US); Jingyun Zhang, Albany, NY (US); Pouya Hashemi, Purchase, NY (US); Alexander Reznicek, Troy, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/445,392

(22) Filed: Jun. 19, 2019

(65) Prior Publication Data
US 2020/0403034 A1 Dec. 24, 2020

(51) Int. Cl.
| | |
|---|---|
| *H01L 27/24* | (2006.01) |
| *H01L 29/06* | (2006.01) |
| *H01L 29/423* | (2006.01) |
| *H01L 29/786* | (2006.01) |
| *G06N 3/063* | (2006.01) |
| *H01L 45/00* | (2006.01) |
| *H01L 29/66* | (2006.01) |

(52) U.S. Cl.
CPC ......... *H01L 27/2436* (2013.01); *G06N 3/063* (2013.01); *H01L 27/2481* (2013.01); *H01L 29/0653* (2013.01); *H01L 29/0673* (2013.01); *H01L 29/42392* (2013.01); *H01L 29/66742* (2013.01); *H01L 29/78696* (2013.01); *H01L 45/08* (2013.01); *H01L 45/1233* (2013.01); *H01L 45/1253* (2013.01); *H01L 45/146* (2013.01); *H01L 45/16* (2013.01)

(58) Field of Classification Search
None
See application file for complete search history.

(56) References Cited

U.S. PATENT DOCUMENTS

| | | | |
|---|---|---|---|
| 8,642,989 | B2 | 2/2014 | Liu et al. |
| 9,520,557 | B2 | 12/2016 | Lu et al. |
| 9,972,386 | B2 | 5/2018 | Blomme et al. |
| 2008/0304308 | A1 | 12/2008 | Stipe |

(Continued)

FOREIGN PATENT DOCUMENTS

KR 101375773 B1 3/2014

OTHER PUBLICATIONS

Pan, "1Kbit FINFET Dielectric (FIND) RRAM in Pure 16nm FinFET CMOS Logic Process", IEEE International Electron Devices Meeting, Dec. 2015, 4 pages.

(Continued)

*Primary Examiner* — Khaja Ahmad
(74) *Attorney, Agent, or Firm* — Tutunjian & Bitetto, P.C.; Randall Bluestone

(57) ABSTRACT

A method for fabricating stacked resistive memory with individual switch control is provided. The method includes forming a first random access memory (ReRAM) device. The method further includes forming a second ReRAM device in a stacked nanosheet configuration on the first ReRAM device. The method also includes forming separate gate contacts for the first ReRAM device and the second ReRAM device.

11 Claims, 9 Drawing Sheets

(56) References Cited

U.S. PATENT DOCUMENTS

| | | | | |
|---|---|---|---|---|
| 2016/0027844 | A1* | 1/2016 | Chung | G11C 13/003 |
| | | | | 365/148 |
| 2016/0087009 | A1* | 3/2016 | Mieno | H01L 45/1233 |
| | | | | 257/4 |
| 2017/0077184 | A1* | 3/2017 | Kikuchi | H01L 27/249 |
| 2017/0221559 | A1* | 8/2017 | Chen | H01L 27/2454 |
| 2017/0236869 | A1* | 8/2017 | Tran | H01L 27/2463 |
| | | | | 257/4 |
| 2017/0309324 | A1* | 10/2017 | Kumar | G11C 13/003 |
| 2017/0316824 | A1 | 11/2017 | Bedau | |
| 2018/0090207 | A1 | 3/2018 | Hou et al. | |
| 2018/0351093 | A1* | 12/2018 | Wu | H01L 45/08 |

OTHER PUBLICATIONS

Gokmen, "Acceleration of Deep Neural Network Training with Resistive Cross-Point Devices: Design Considerations", Frontiers in Neuroscience, vol. 10, Article 333, Jul. 2016, 13 pages.

Burr, "Experimental Demonstration and Tolerance of a Large-Scale Neural Network (165,000 Synapses), Using Phase-Change Memory as the Synaptic Weight Element", IEEE International Electron Devices Meeting, Dec. 2014, pp. 697-700.

* cited by examiner

400

Provide layers of channel material with dielectric isolation layer in the middle and a temporary layer at the bottom
410

Recess top ReRAM electrode
420

Deposit isolation layer and recess
430

Deposit top ReRAM electrode
440

Replace temporary layer with conductive contact
450

Form vias for top ReRAM and bottom ReRam
460

FIG. 11

STACKED RESISTIVE MEMORY WITH INDIVIDUAL SWITCH CONTROL

BACKGROUND

The present invention generally relates to semiconductor devices, and more particularly to resistive random-access memories, and methods of forming the same.

Resistive random access memory (ReRAM or RRAM) is a technology that can be used to implement electronic synapse devices or memristors for neuromorphic computing as well as high-density and high-speed non-volatile memory applications. In neuromorphic computing applications, a resistive memory device can be used as a connection (synapse) between a pre-neuron and post-neuron, representing the connection weight in the form of device resistance. Multiple pre-neurons and post-neurons can be connected through a crossbar array of ReRAMs, which expresses a fully-connected neural network.

SUMMARY

In accordance with an embodiment of the present invention, a method for fabricating stacked resistive memory with individual switch control is provided. The method includes forming a first random access memory (ReRAM) device. The method further includes forming a second ReRAM device in a stacked nanosheet configuration on the first ReRAM device. The method also includes forming separate gate contacts for the first ReRAM device and the second ReRAM device.

In accordance with an embodiment of the present invention, a semiconductor device includes stacked resistive memory with individual switch control. More particularly, the semiconductor device includes two resistive random access memory (ReRAM) devices stacked in a nanosheet configuration, and separate gate contacts for each of the two ReRAM devices. The semiconductor device also includes isolation layers within stacked nanosheets of the two ReRAM devices and within source and drain regions of the two ReRAM devices.

In accordance with an embodiment of the present invention, a synapse connecting a pre-neuron and a post neuron in a neuromorphic device is provided. The synapse includes a top resistive random access memory (ReRAM) device and a bottom ReRAM device stacked in a nanosheet configuration. The synapse also includes an isolation layer in a middle of the top ReRAM device and the bottom ReRAM device. The synapse further includes a filament localized at a nanosheet corner for each of the top ReRAM device and the bottom ReRAM device. There are separate gate contacts for each of the top ReRAM device and the bottom ReRAM device. The top ReRAM device and the bottom ReRAM device are integrated in tight pitch to represent one synaptic weight.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 11 is a flow diagram showing a method formation of stacked resistive memory with individual switch control, in accordance with an embodiment of the present invention.

DETAILED DESCRIPTION

Figure 2:
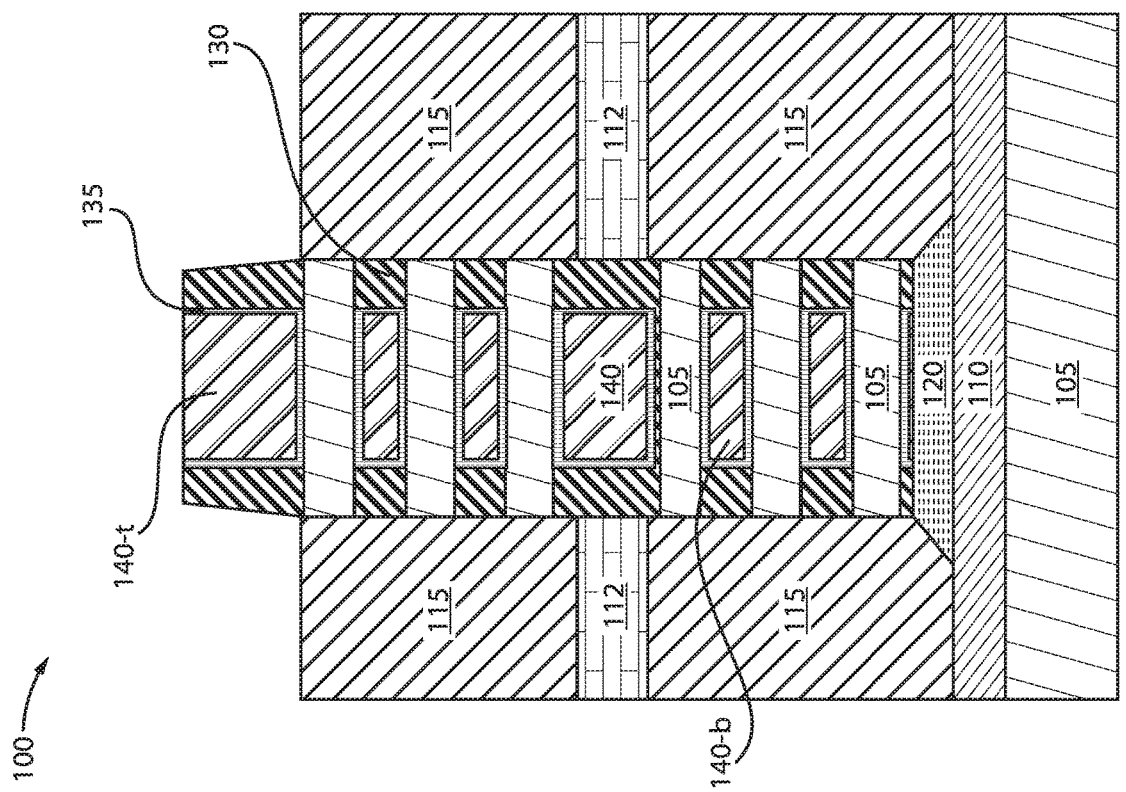
FIG. 2 is a cross-sectional view showing recess of resistive random access memory (ReRAM or RRAM) top electrode from the top sheets, in accordance with an embodiment of the present invention.

Embodiments of the present invention relate generally to a structure with resistive random access memory (RRAM or ReRAM) devices formed within stacked nano sheets and methods of forming the same. Isolation layers are formed both within the stacked nanosheets and within the source/drain regions. The structure (including isolation layers) enables individual programming of a plurality of ReRAM devices.

In one embodiment, the structure can include two ReRAM devices stacked in a nanosheet configuration with separate gate contacts. The device structure enables individual control of the stacked ReRAM devices.

For online training (weight update) of deep neural network (DNN), the structures described herein below provide two unipolar ReRAM with linear switching for differential weight. The structures described herein provide benefits when compared to prior methods of implementing two unipolar ReRAM with linear switching for differential weight as the structure does not require more devices and periphery circuits to represent one weight and the structure does not include an area penalty (for example, does not take up extra area on a chip). The example embodiments provide solutions to integrate ReRAM devices to represent one synaptic weight without additional area penalty as well as matched switching characteristics for the ReRAM devices.

The example embodiments include a plurality of stacked ReRAMs in which each ReRAM is isolated from the other and each can be independently switched. According to example embodiments, the stack is fabricated using stacked nanosheets.

Exemplary applications/uses to which the present invention can be applied include, but are not limited to acceleration of deep neural network (DNN) training by use of tightly scaled pairs of ReRAM devices to represent synaptic weights.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer may be by one or more deposition processes, where, for example, a conformal layer can be formed by a first process (e.g., ALD, PEALD, etc.) and a fill can be formed by a second process (e.g., CVD, electrodeposition, PVD, etc.).

It should be noted that materials may be referred to only by their composition constituent, e.g., silicon, nitrogen, oxygen, carbon, hafnium, titanium, etc., without specifying a particular stoichiometry (e.g., SiGe, $SiO_2$, $Si_3N_4$, $HfO_2$, etc.) in recognition that the stoichiometry can vary based on formation processes, processing parameters, intentional non-stoichiometric fabrication, deposition tolerance, etc. Reference to only the composition constituents (e.g., SiO, SiN, TiN, etc.) is, therefore, intended to refer to all suitable stoichiometric ratios for the identified composition. In addition, other elements can be included in the compound and still function in accordance with the present principles. The compounds with additional elements will be referred to herein as alloys.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc.

It is to be understood that aspects of the present invention will be described in terms of a given illustrative architecture; however, other architectures, structures, substrate materials and process features and steps can be varied within the scope of aspects of the present invention.

It should be noted that certain features may not be shown in all figures for the sake of clarity. This is not intended to be interpreted as a limitation of any particular embodiment, or illustration, or scope of the claims.

FIGS. 1 to 6 collectively (and, in this particular instance, sequentially) illustrate an example embodiment of processes that may be implemented for forming a structure of stacked nanosheets with isolation at the middle and two separate electrode contacts. Operations of, e.g., two stacked ReRAM devices are isolated by an $SiO_2$ isolation layer in source/drain (S/D) region and an SiN isolation layer in the middle of metal gate. The example embodiments provide a structure and method to (concurrently) facilitate controlled filament formation in ReRAM oxide and integration of pairs of ReRAM devices with a contacted gate (poly) pitch (CPP) of an order equivalent to the CPP of the most advanced CMOS technology. A CPP is a distance between gates of CMOS transistors. ReRAM devices in tight pitch are located close to each other. For example, the CPP for 14 nm CMOS technologies incorporating the example embodiments can be 100 nm or lower. In contrast to (for example, oxide) ReRAM in which electroforming of current conducting filament is often implemented, the embodiments described herein allow ReRAM cell area scaling. In the example embodiments, the process controls the position of the filament (in contrast to ReRAM that relies on randomness and the position of filament is not under control). This results in a lower forming voltage as ReRAM is scaled and lower device variability.

The processes described with respect to FIGS. 1 to 6 results in at least a pair of ReRAMs receiving the same ReRAM electrode material (for example, metal oxide) deposition and the device size being defined at the same time with the same mask pattern. This appreciably improves matching of switching characteristics when compared to a pair of ReRAMs fabricated separately. Moreover, the pair of ReRAMs fabricated by the processes described in FIGS. 1 to 6 carry no area penalty over previous conventional designs.

Figure 1:
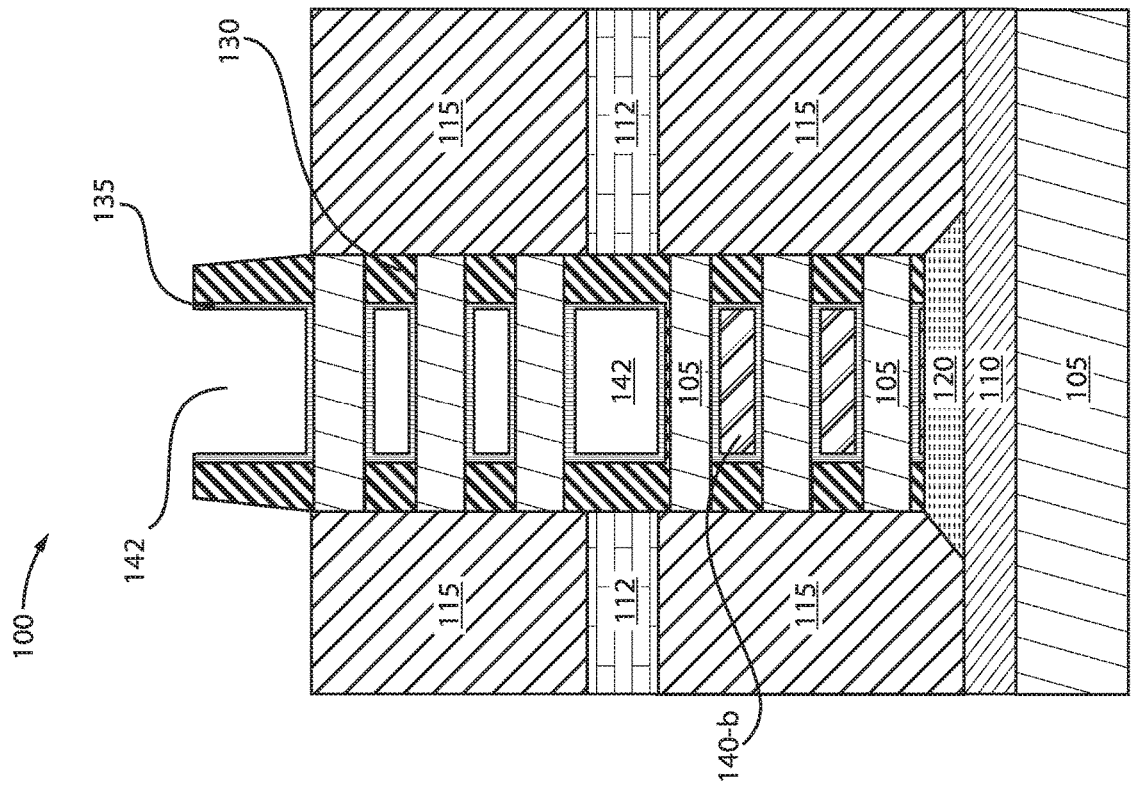
FIG. 1 is a cross-sectional view showing multiple layers of channel with a dielectric isolation layer centrally disposed and a bottom semiconductor layer at the bottom, in accordance with an embodiment of the present invention.

Referring now to the drawings in which like numerals represent the same or similar elements and initially to FIG. 1, a cross-sectional view 100 showing multiple layers of a channel with a dielectric isolation layer centrally disposed, and a bottom semiconductor layer at the bottom is provided, in accordance with an embodiment of the present invention.

As shown in FIG. 1, the fabrication process initially includes nanosheets with multiple (as illustrated in FIG. 1, 6 (six)) layers of semiconductor channel material 105 with a first dielectric isolation layer 112 (for example, $SiO_2$) in the middle (for example, centrally disposed, at a mid-point, etc.) and a bottom semiconductor layer 120 (for example, a low germanium (Ge) content silicon-germanium (SiGe) layer) at the bottom of the nanosheets. A nanosheet can be defined as a two-dimensional nanostructure with thickness in a scale ranging from, e.g., 1 to 100 nm. A second dielectric isolation layer 110 is positioned below the bottom semiconductor layer 120. The first dielectric isolation layer 112 and/or second dielectric isolation layer 110 can be formed, for example, by etching a trenching into the semiconductor channel material 105, and filling the trench with an insulating material, such as, for example, a high dielectric constant (high-k) dielectric material such as a suitable oxide or nitride.

The device 100 includes electrode material 140 (for example, an electrode that includes layers of conductive material such as titanium nitride (TiN), Aluminum (Al)-containing alloy, and TiN, etc.) including a top ReRAM electrode 140-t substantially enclosed in a high dielectric constant material 135 (for example, $HfO_2$) within a semiconductor (for example, Si) layer 105.

The structure includes a source and/or drain (for example, p-doped (or p-type) or in other instances n-doped (or n-type) semiconductor material) 115. A p-type semiconductor is formed by, for example, depositing a layer of a semiconductor material with in situ or subsequent implantation of p-type dopants. Examples of p-type dopants, for example, impurities, include but are not limited to: boron, aluminum, gallium and indium.

FIG. 2 is a cross-sectional view showing a recess of resistive random access memory (ReRAM) top electrode from the top sheets, in accordance with example embodiments.

As shown in FIG. 2, electrode material (particularly top ReRAM electrode 140-t) is recessed from the top nanosheets (for example, recessed from the top 3 layers of channel material). The electrode material 140 can be recessed using a process that stops on the high dielectric constant material 135. Recessing the top electrode 140-*t* (previously shown in FIG. 1) while stopping on the high dielectric constant material 135 leaves a space 142 enclosed by the high dielectric constant material 135.

Figure 3:
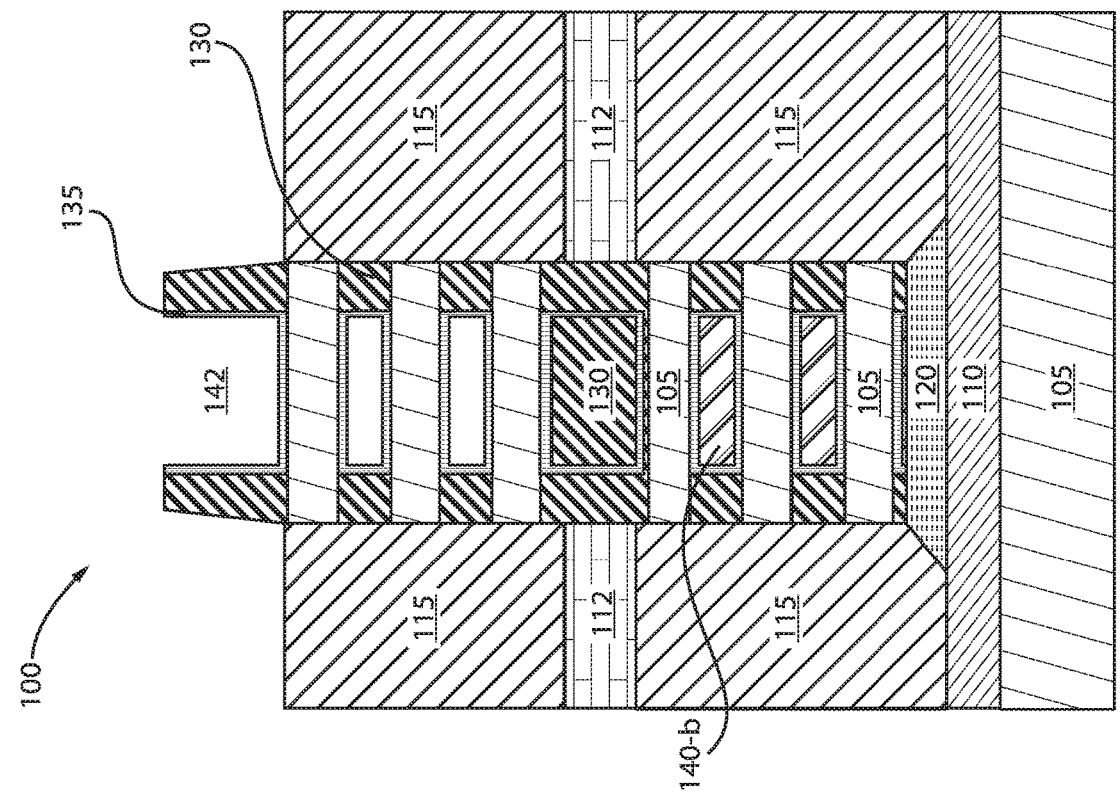
FIG. 3 is a cross-sectional view showing deposition of an isolation layer and recess, in accordance with an embodiment of the present invention.

FIG. 3 is a cross-sectional view showing deposition of an isolation layer and recess, in accordance with example embodiments.

As shown in FIG. 3, an isolation layer 130 (for example, SiN) is deposited and recessed at the approximate center of the structure. The isolation layer 130 is deposited on the recessed top electrodes and recessed to expose the top nanosheets.

Figure 4:
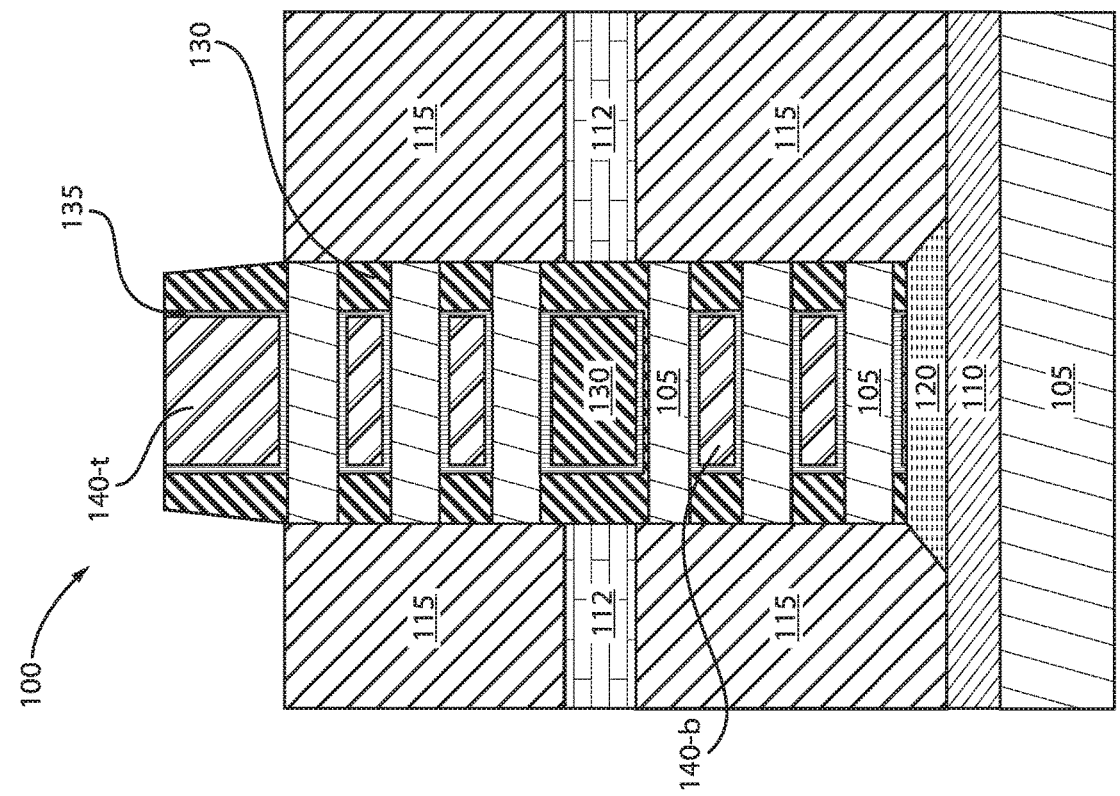
FIG. 4 is a cross-sectional view showing deposition of a top ReRAM electrode for the top sheets, in accordance with an embodiment of the present invention.

FIG. 4 is a cross-sectional view showing deposition of a top ReRAM electrode for the top sheets, in accordance with example embodiments.

As shown in FIG. 4, a top ReRAM electrode 140-*t* for the top (three (3) sheets as shown) sheets is deposited. The top sheets include the top ReRAM electrode 140-*t* material, the top (3 (three) layers of the 6 (*six*)) layers of semiconductor channel material 105, isolation layers 130 and the source/drain 115. The top sheets, which correspond to the top ReRAM electrode 140-*t*, are to be used in forming one of two ReRAM devices formed within stacked nano sheets. The bottom sheets, which correspond to the bottom ReRAM electrode 140-*b* are to be used in forming the other of two ReRAM devices formed within stacked nanosheets. The (top) ReRAM electrode 140-*t* is separated from the (bottom) ReRAM electrode 140-*b* by isolation layer 130.

Figure 5:
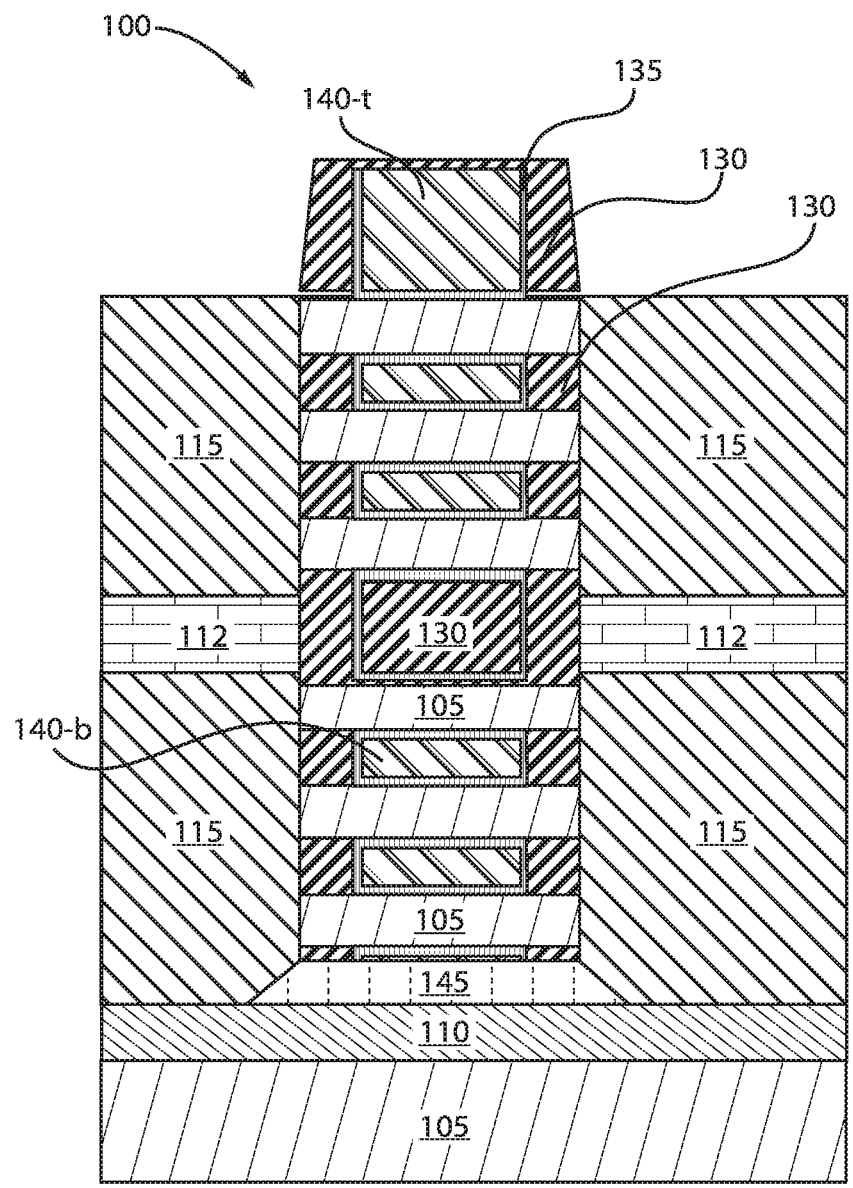
FIG. 5 is a cross-sectional view showing replacement of the bottom semiconductor layer with a bottom metal contact, in accordance with an embodiment of the present invention.

FIG. 5 is a cross-sectional view showing replacement of the bottom semiconductor layer with a bottom metal contact, in accordance with example embodiments.

As shown in FIG. 5, the bottom semiconductor layer 120 (for example, low Ge content SiGe layer) is replaced with a bottom metal contact 145. The bottom metal contact can include a conductive material, such as, for example, Tungsten (W), copper (Cu), aluminum (Al), cobalt (Co) etc. The bottom metal contact 145 is formed between the bottom electrodes 140-*b* and the second dielectric isolation layer 110.

Figure 6:
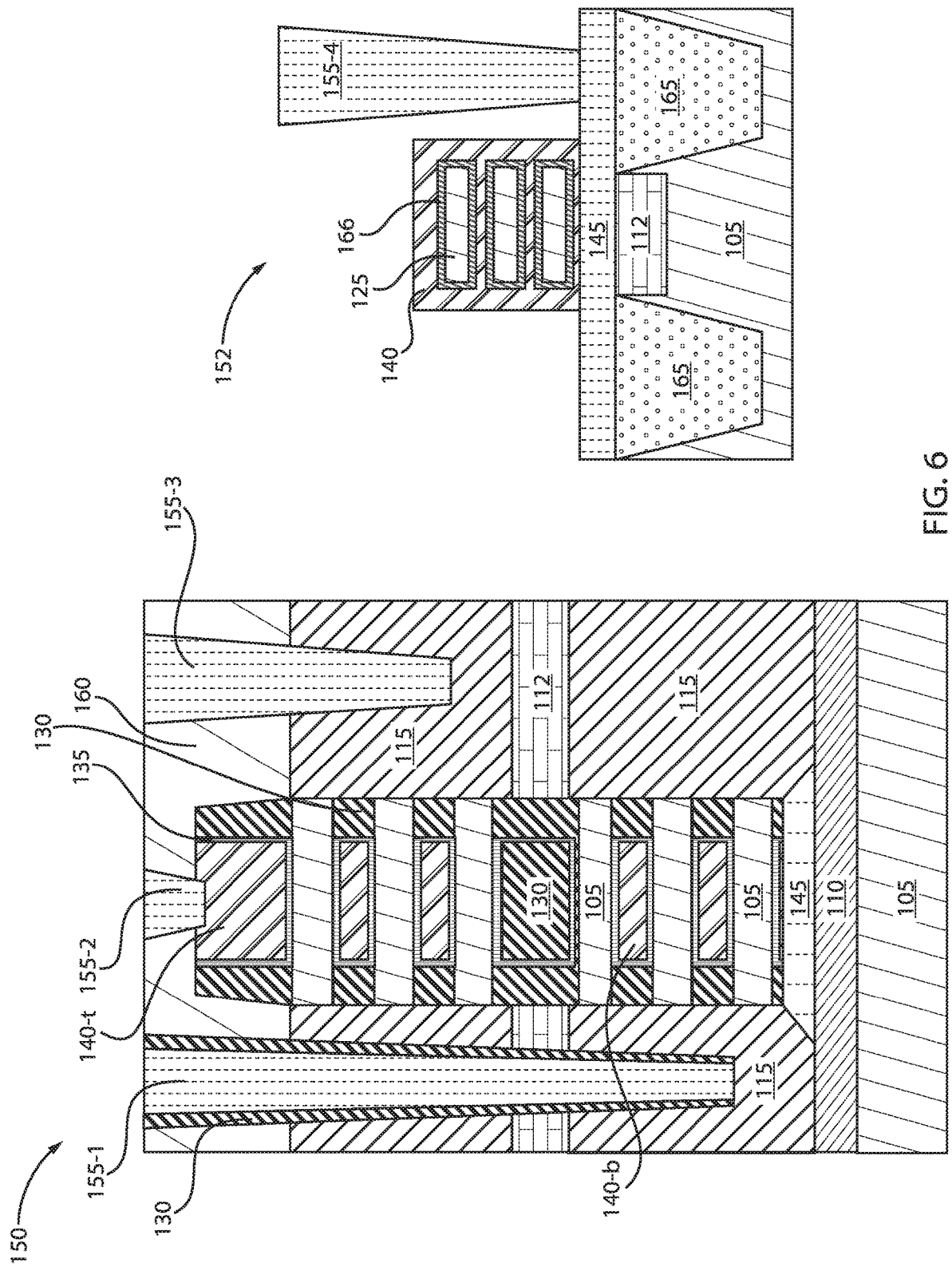
FIG. 6 is cross-sectional views showing contact VIAs formation from a position parallel and a perpendicular to the nanosheets, in accordance with an embodiment of the present invention.

FIG. 6 provides cross-sectional views showing contact vias formation parallel and perpendicular to nanosheets, in accordance with example embodiments.

As shown in FIG. 6, vias 155 can be formed by patterning a first via 155-1 to the bottom source/drain 115 and filling the first via 155-1 with an isolation layer 130 and etching it back to form sidewall protection, followed by filling with a (for example, first) conductive material (for example W), and patterning a second via 155-2 to the top electrode 140-*t*, filling the second via 155-2 with a (for example, second) conductive material (for example, Tungsten (W)). Then, a third via 155-3 is formed by patterning a via to the top source/drain 115 and filling the third via 155-3 with a third conductive material (for example W). That is, vias 155-1 through 155-3 are shown as staggered contacts. Finally, a fourth via 155-4 is formed by patterning a via to the bottom metal contact 145 and filling the fourth via 155-4 with a fourth conductive material (for example W). Each of the vias 155 can include a same conductive material, or at least one of the vias (for example, contacts) 155-1 through 155-4 can include a different conductive material.

Cross-sectional view 150 illustrates the device when viewed from a perspective parallel to nanosheets. As shown, the first via 155-1 is enclosed in a dielectric layer 130. Via 155-1 provides a contact to the bottom source/drain 115. Via 155-2 provides a contact to the top electrode 140-*t*. Via 155-3 provides a contact for the top source/drain (for example, p-doped (or p-type) semiconductor material) 115.

Cross-sectional view 152 illustrates the device when viewed from a perspective perpendicular to nanosheets. As shown in FIG. 6, the device includes a substrate 105, an isolation layer 112, a metal contact 145 and a via 155 to the metal contact 145. Shallow trench isolation 165 (e.g. SiO$_2$) can be used for device isolation. A liner layer 166 (for example, a metal oxide layer (e.g. HfO2)) can be used for RRAM switching layer.

The structure thus formed includes two unipolar ReRAM with linear switching that can be used to represent differential weight. This allows online training (including, for example, weight update) of DNN. In contrast, the structure described herein includes two ReRAM devices (top ReRAM 170 and a bottom ReRAM 180 as described further below with respect to FIGS. 7 and 8) formed within stacked nanosheets. Isolation layers are formed both within the stacked nanosheets and within the source/drain regions. This enables individual programming of the pair of ReRAM devices. The example embodiments integrate a pair of ReRAM devices to represent one synaptic weight without additional area penalty as well as matched switching characteristics for the two ReRAM devices.

Figure 7:
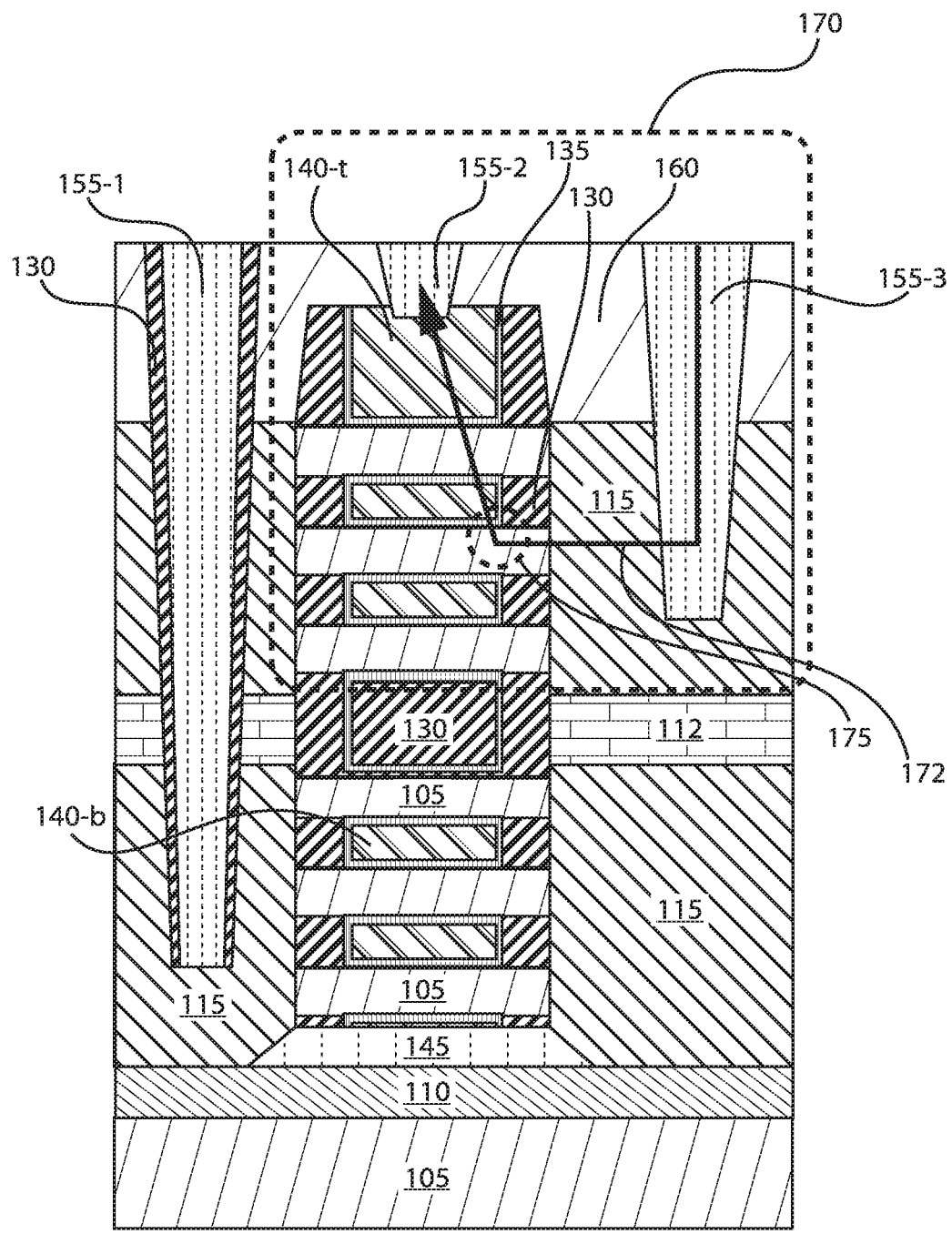
FIG. 7 is a cross-sectional view showing operation of top ReRAM, in accordance with an embodiment of the present invention.
Figure 8:
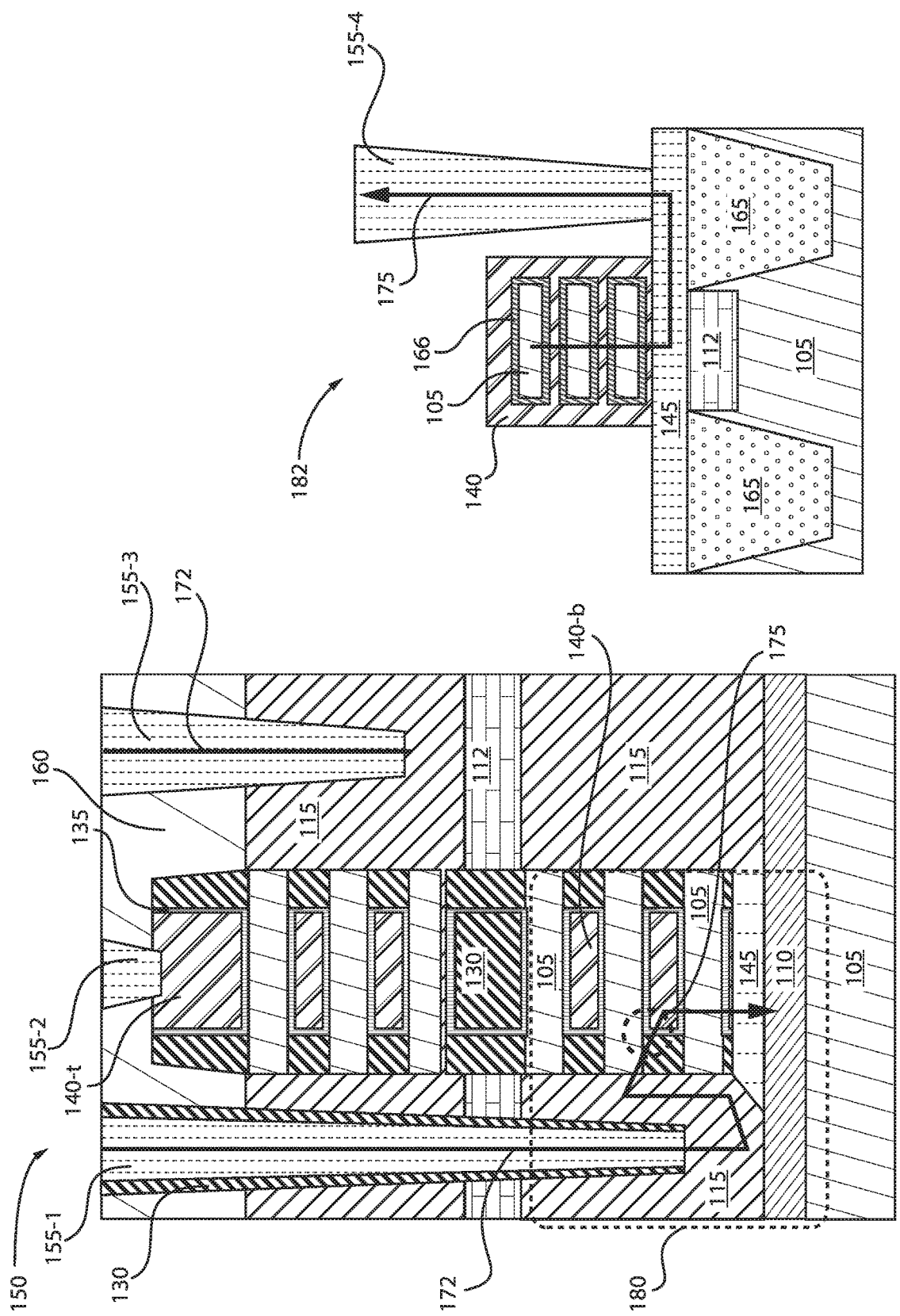
FIG. 8 is a cross-sectional view showing operation of bottom ReRAM, in accordance with an embodiment of the present invention.

As shown in FIGS. 7 and 8, which illustrates cross-sectional views parallel to nanosheets, the device 100 includes a top ReRAM 170 and a bottom ReRAM 180.

FIG. 7 is a cross-sectional view showing operation of top ReRAM 170, in accordance with example embodiments.

As shown in FIG. 7, operation of top ReRAM 170 includes a current flow 172 from the via 155-3 (at p-doped (or p-type) semiconductor material 115) across the filament localized at the nanosheet corner 175 to the via 155-2. Top ReRAM 170 is separated from the bottom electrodes by first dielectric isolation layer 112 and dielectric layer 130.

The top ReRAM 170 is a unipolar ReRAM with linear switching, as is the bottom ReRAM 180. The devices are formed in tight pitch and obviate the need for more devices and periphery circuits to represent one weight that comes with a conventional device. In addition, the example embodiments do not come with an area penalty, in contrast to incumbent and conventional devices. The structure provides a pair of (or paired) unipolar ReRAM devices that can be used to represent one weight for DNN online training.

FIG. 8 is a cross-sectional view showing operation of bottom ReRAM 180, in accordance with example embodiments.

As shown in FIG. 8, which illustrates a cross-sectional view 150 parallel to nanosheets, operation of bottom ReRAM 170 includes a current flow 175 from the via 155-1 (at p-doped (or p-type) semiconductor material 115) across the filament localized at the nanosheet corner 175 to the metal contact 145. Bottom ReRAM 170 is separated from the top electrodes by first dielectric isolation layer 112 and dielectric layer 130.

Cross-sectional view 182 illustrates current flow in the device when viewed from a perspective perpendicular to nanosheets. As shown in FIG. 8, the current flows 175 across the semiconductor layers 105 through the metal contact 145 to the via 155-4. The structure formed facilitates controlled filament formation in ReRAM oxide and integration of pairs of two ReRAM devices in tight pitch at the same time.

Figure 9:
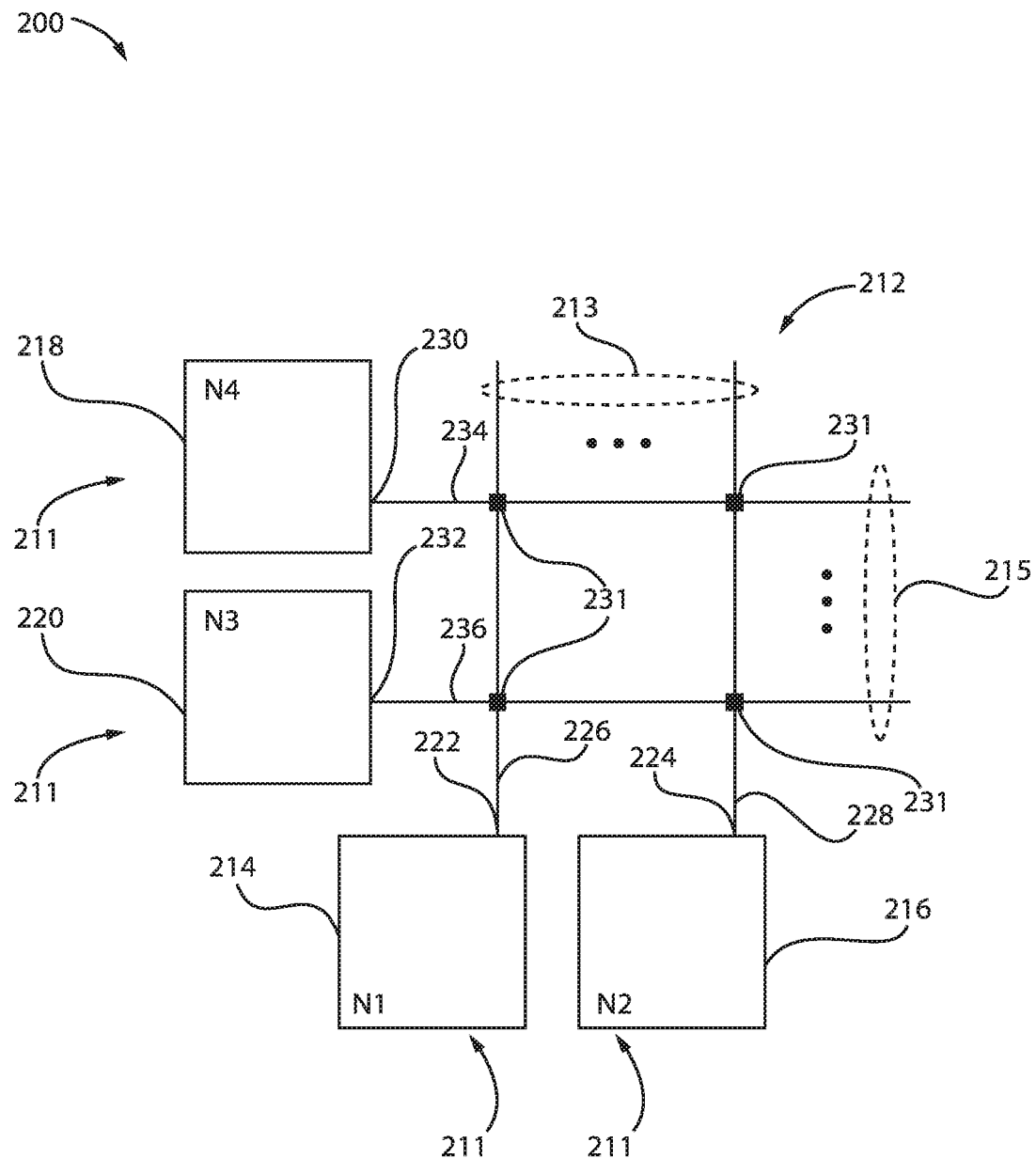
FIG. 9 is a block/flow diagram of an exemplary neuromorphic and synaptronic network including a crossbar of electronic synapses interconnecting electronic neurons and axons, in accordance with an embodiment of the present invention.

FIG. 9 is a block/flow diagram of an exemplary neuromorphic and synaptronic network including a crossbar of electronic synapses interconnecting electronic neurons and axons, in accordance with an embodiment of the present invention.

The example tile circuit 200 has a crossbar 212 in accordance with an embodiment of the invention. In one example, the overall circuit can include an "ultra-dense crossbar array" that can have a pitch in the range of about, e.g., 0.1 nm to 10 μm. The neuromorphic and synaptronic circuit 200 includes the crossbar 212 interconnecting a plurality of digital neurons 211 including neurons 214, 216, 218 and 220. These neurons 211 are also referred to herein as "electronic neurons." For illustration purposes, the example circuit 200 provides symmetric connections between the two pairs of neurons (e.g., N1 and N3). However, embodiments of the invention are not only useful with such symmetric connection of neurons, but also useful with asymmetric connection of neurons (neurons N1 and N3 need not be connected with the same connection). The cross-bar in a tile accommodates the appropriate ratio of synapses to neurons, and, hence, need not be square.

In the example circuit 200, the neurons 211 are connected to the crossbar 212 via dendrite paths/wires (dendrites) 213 such as dendrites 226 and 228. Neurons 211 are also connected to the crossbar 212 via axon paths/wires (axons) 215 such as axons 234 and 236. Neurons 214 and 216 are dendritic neurons and neurons 218 and 220 are axonal neurons connected with axons 213. Specifically, neurons 214 and 216 are shown with outputs 222 and 224 connected to dendrites (e.g., bitlines) 226 and 228, respectively. Axonal neurons 218 and 220 are shown with outputs 230 and 232 connected to axons (e.g., wordlines or access lines) 234 and 236, respectively.

When any of the neurons 214, 216, 218 and 220 fire, they will send a pulse out to their axonal and to their dendritic connections. Each synapse provides contact between an axon of a neuron and a dendrite on another neuron and with respect to the synapse, the two neurons are respectively called pre-synaptic and post-synaptic.

Each connection between dendrites 226, 228 and axons 234, 236 are made through a digital synapse device 231 (synapse). The junctions where the synapse devices are located can be referred to herein as "cross-point junctions." In general, in accordance with an embodiment of the invention, neurons 214 and 216 will "fire" (transmit a pulse) in response to the inputs they receive from axonal input connections (not shown) exceeding a threshold. Neurons 218 and 220 will "fire" (transmit a pulse) in response to the inputs they receive from external input connections (not shown), usually from other neurons, exceeding a threshold. In one embodiment, when neurons 214 and 216 fire they maintain a postsynaptic-STDP (post-STDP) variable that decays. For example, in one embodiment, the decay period can be 50 ms. The post-STDP variable is used to achieve STDP by encoding the time since the last firing of the associated neuron. Such STDP is used to control long-term potentiation or "potentiation," which in this context is defined as increasing synaptic conductance. When neurons 218, 220 fire they maintain a pre-STDP (presynaptic-STDP) variable that decays in a similar fashion as that of neurons 214 and 216.

Pre-STDP and post-STDP variables can decay according to exponential, linear, polynomial, or quadratic functions, for example. In another embodiment of the invention, the variables can increase instead of decreasing over time. In any event, this variable can be used to achieve STDP by encoding the time since the last firing of the associated neuron. STDP is used to control long-term depression or "depression," which in this context is defined as decreasing synaptic conductance. Note that the roles of pre-STDP and post-STDP variables can be reversed with pre-STDP implementing potentiation and post-STDP implementing depression.

An external two-way communication environment can supply sensory inputs and consume motor outputs. Digital neurons 211 implemented using complementary metal oxide semiconductor (CMOS) logic gates receive spike inputs and integrate them. In one embodiment, the neurons 211 include comparator circuits that generate spikes when the integrated input exceeds a threshold. In one embodiment, binary synapses are implemented using transposable 1-bit static random-access memory (SRAM) cells, wherein each neuron 211 can be an excitatory or inhibitory neuron (or both). Each learning rule on each neuron axon and dendrite are reconfigurable as described below. This assumes a transposable access to the crossbar memory array. Neurons that spike are selected one at a time sending spike events to corresponding axons, where axons could reside on the core or somewhere else in a larger system with many cores.

The term electronic neuron as used herein represents an architecture configured to simulate a biological neuron. An electronic neuron creates connections between processing elements that are roughly functionally equivalent to neurons of a biological brain. As such, a neuromorphic and synaptronic system including electronic neurons according to embodiments of the invention can include various electronic circuits that are modeled on biological neurons. Further, a neuromorphic and synaptronic system including electronic neurons according to embodiments of the invention can include various processing elements (including computer simulations) that are modeled on biological neurons. Although certain illustrative embodiments of the invention are described herein using electronic neurons including electronic circuits, the present invention is not limited to electronic circuits. A neuromorphic and synaptronic system according to embodiments of the invention can be implemented as a neuromorphic and synaptronic architecture including circuitry, and additionally as a computer simulation. Indeed, embodiments of the invention can take the form of an entirely hardware embodiment, an entirely software embodiment, or an embodiment including both hardware and software elements.

Figure 10:
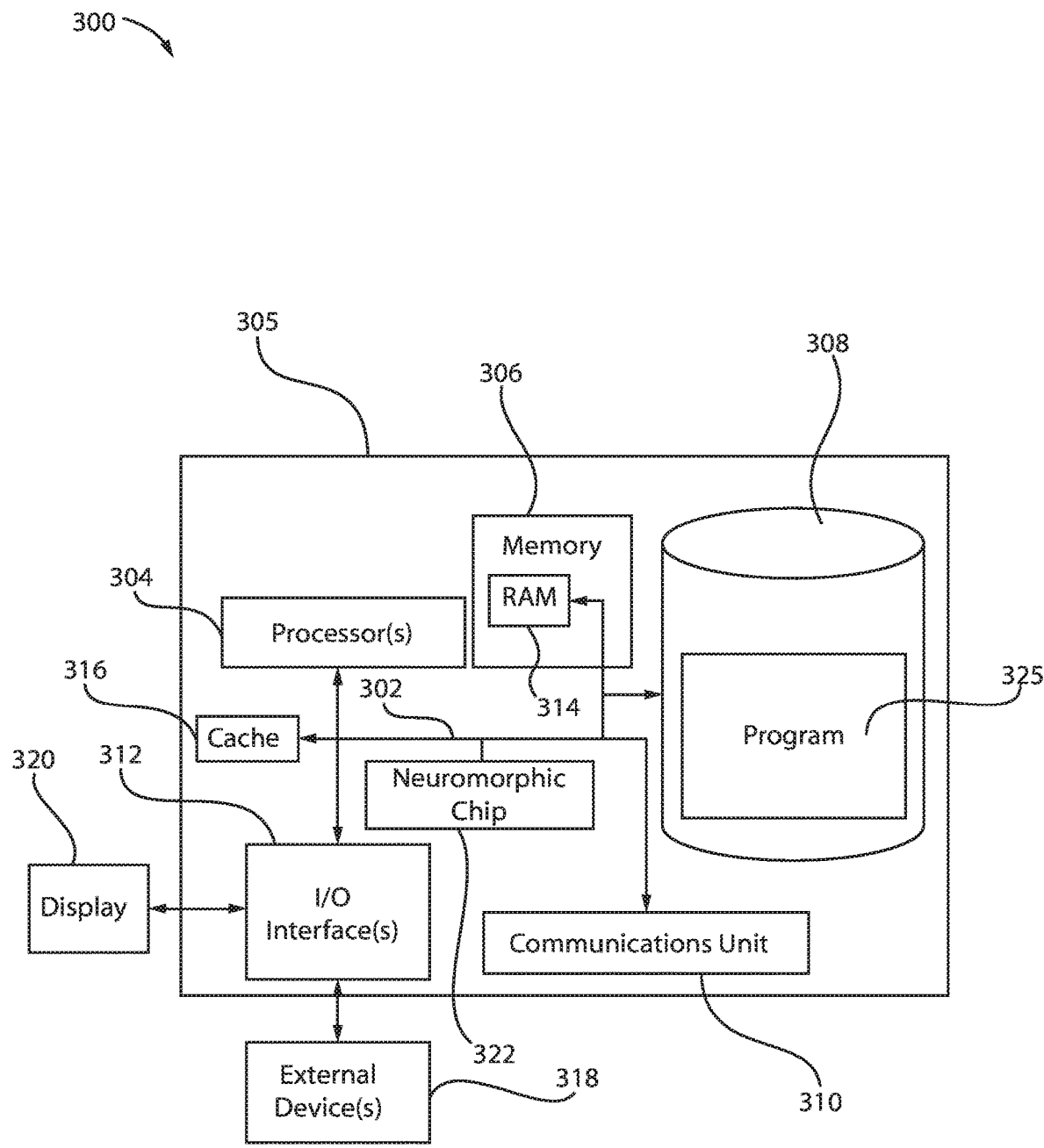
FIG. 10 depicts a block diagram of components of a computing system including a computing device and a neuromorphic chip capable of operationally performing deep learning sampling, in accordance with an embodiment of the present invention.

FIG. 10 depicts a block diagram of components of a computing system including a computing device and a neuromorphic chip capable of operationally performing deep learning sampling, in accordance with an embodiment of the present invention.

FIG. 10 depicts a block diagram of components of system 300, which includes computing device 305. It should be appreciated that FIG. 10 provides only an illustration of one implementation and does not imply any limitations with regard to the environments in which different embodiments can be implemented. Many modifications to the depicted environment can be made.

Computing device 305 includes communications fabric 302, which provides communications between computer processor(s) 304, memory 306, persistent storage 308, communications unit 310, and input/output (I/O) interface(s) 312. Communications fabric 302 can be implemented with any architecture designed for passing data and/or control information between processors (such as microprocessors, communications and network processors, etc.), system memory, peripheral devices, and any other hardware components within a system. For example, communications fabric 302 can be implemented with one or more buses.

Memory 306, cache memory 316, and persistent storage 308 are computer readable storage media. In this embodiment, memory 306 includes random access memory (RAM) 314. In general, memory 306 can include any suitable volatile or non-volatile computer readable storage media.

In some embodiments of the present invention, deep learning program 325 is included and operated by neuromorphic chip 322 as a component of computing device 305. In other embodiments, deep learning program 325 is stored in persistent storage 308 for execution by neuromorphic chip 322 in conjunction with one or more of the respective computer processors 304 via one or more memories of memory 306. In this embodiment, persistent storage 308 includes a magnetic hard disk drive. Alternatively, or in addition to a magnetic hard disk drive, persistent storage 308 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 308 can also be removable. For example, a removable hard drive can be used for persistent storage 308. Other examples include optical and magnetic disks, thumb drives, and smart cards that are inserted into a drive for transfer onto another computer readable storage medium that is also part of persistent storage 308.

In some embodiments of the present invention, neuromorphic chip 322 is included in computing device 305 and connected to communications fabric 302. Neuromorphic chip 322 includes electronic logic to provide stacked restricted Boltzmann machines, and a feed forward neural network, including deep learning algorithmic components that are trainable and perform machine learning. In other embodiments, the logistical and algorithmic components operations are performed by specialized data structures, included within computing device 305, which perform the deep learning functions of the stacked restricted Boltzmann machines, and feed forward neural network.

Communications unit 310, in these examples, provides for communications with other data processing systems or devices, including resources of distributed data processing environment. In these examples, communications unit 310 includes one or more network interface cards. Communications unit 310 can provide communications through the use of either or both physical and wireless communications links. Deep learning program 325 can be downloaded to persistent storage 308 through communications unit 310.

I/O interface(s) 312 allows for input and output of data with other devices that can be connected to computing system 200. For example, I/O interface 312 can provide a connection to external devices 318 such as a keyboard, keypad, a touch screen, and/or some other suitable input device. External devices 318 can also include portable computer readable storage media such as, for example, thumb drives, portable optical or magnetic disks, and memory cards.

Display 320 provides a mechanism to display data to a user and can be, for example, a computer monitor.

FIG. 11 is a flow diagram showing a method 400 of forming stacked resistive memory with individual switch control, in accordance with an example embodiment.

In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

At block 410, fabrication of the stacked resistive memory with individual switch control begins with providing (for example, 6 layers of channel material with a dielectric (for example, $SiO_2$) isolation layer in the middle and a temporary layer (for example, a low Ge content SiGe layer, which is to be replaced later in the fabrication process as described with respect to block 450) positioned at the bottom (for example, at the opposite end to the top electrode), as described with respect to FIG. 1 hereinabove. The layers are provided in nanosheets.

At block 420, the top ReRAM electrode 140-t is recessed from the top (for example, half of the sheet, in this instance three) sheets. The process also recesses a middle portion of the electrode material into which the isolation layer is to be deposited.

At block 430, the process includes deposition of isolation layer 112 (e.g. SiN) and recess of the isolation layer 112. The isolation layer 112 is recessed to expose the top nanosheets for the ReRAM device.

At block 440, the process includes deposition of top ReRAM electrode 140-t for the top (for example, three) nano sheets.

At block 450, the process includes replacement of temporary layers (for example, low Ge content SiGe layer) with bottom conductive (for example, metal) contact, for example, as described with respect to FIG. 5 herein above.

At block 460, fabrication of the stacked resistive memory with individual switch control includes contact vias formation (for a top ReRAM 170 and a bottom ReRAM 180). The device includes a top ReRAM and a bottom ReRAM in each of which the filament is localized at the nanosheet corner.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method for fabricating stacked resistive memory with individual switch control (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating stacked resistive memory with individual switch control, comprising:
   forming a first resistive random access memory (ReRAM) device with multiple layers of channel material;
   recessing a top portion of an electrode material from a top portion of the multiple layers of channel material;
   forming a second ReRAM device stacked in a nanosheet configuration on the first ReRAM device; and
   forming separate gate contacts for the first ReRAM device and the second ReRAM device.

2. The method of claim 1, wherein forming the first ReRAM device and the second ReRAM device further comprises:
   forming nanosheets including the multiple layers of channel material with a temporary layer positioned at a bottom of the nanosheets; and
   recessing a top portion of an electrode material from a top portion of the nanosheets of the second ReRAM device.

3. The method of claim 2, further comprising:
   depositing an isolation layer in a middle portion of the nanosheets.

4. The method of claim 2, further comprising:
   depositing a top resistive electrode in the top portion of the nanosheets.

5. The method of claim 2, further comprising:
   replacing the temporary layer with a conductive contact.

6. The method of claim 5, wherein the temporary layer includes a silicon-germanium (SiGe) layer.

7. The method of claim 1, further comprising:
   forming the first ReRAM device and the second ReRAM device as two unipolar ReRAM devices with linear switching to represent differential weight.

8. The method of claim 1, further comprising
   forming vias to a top ReRAM electrode and source/drain and a bottom ReRAM electrode and source/drain, wherein the top ReRAM electrode and the bottom ReRAM electrode are included in the first ReRAM device and the second ReRAM device.

9. The method of claim 1, further comprising:
   isolating operations of the first ReRAM device and the second ReRAM device by a first isolation layer in a source/drain region and a second isolation layer in a middle portion of nanosheets.

10. The method of claim 1, further comprising:
    determining a size of each of the first ReRAM device and the second ReRAM device at a same time and with a same mask pattern.

11. The method of claim 1, further comprising:
    forming each of the first ReRAM device and the second ReRAM device to localize a filament at a nanosheet corner of each of the first ReRAM device and the second ReRAM device.

* * * * *